(12) United States Patent
Babbs et al.

(10) Patent No.: US 7,798,801 B2
(45) Date of Patent: Sep. 21, 2010

(54) CHUCKING SYSTEM FOR NANO-MANUFACTURING

(75) Inventors: Daniel A. Babbs, Austin, TX (US);
Byung-Jin Choi, Austin, TX (US);
Anshuman Cherala, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 913 days.

(21) Appl. No.: 11/047,428

(22) Filed: Jan. 31, 2005

(65) Prior Publication Data
US 2006/0172031 A1   Aug. 3, 2006

Related U.S. Application Data

(62) Division of application No. 11/047,499, filed on Jan. 31, 2005, now Pat. No. 7,636,999.

(51) Int. Cl.
B29C 59/00 (2006.01)
G03B 27/64 (2006.01)

(52) U.S. Cl. .................. 425/385; 355/76; 425/193; 425/397

(58) Field of Classification Search .............. 425/389, 425/390, 810, 385, 183, 185, 397, 193, 388; 355/76, 78; 101/3.1, 28
See application file for complete search history.

(56) References Cited

U.S. PATENT DOCUMENTS

| | | | |
|---|---|---|---|
| 4,233,261 A * | 11/1980 | Mijnheer | 264/293 |
| 4,391,511 A | 7/1983 | Akiyama et al. | |
| 4,506,184 A | 3/1985 | Siddall | |
| 4,551,192 A | 11/1985 | Di Milia et al. | |
| 4,559,717 A | 12/1985 | Scire et al. | |
| 5,324,012 A | 6/1994 | Aoyama et al. | |
| 5,331,371 A | 7/1994 | Mori et al. | |
| 5,515,167 A | 5/1996 | Ledger et al. | |
| 5,534,073 A | 7/1996 | Kinoshita et al. | |
| 5,563,684 A | 10/1996 | Stagaman | |
| 5,900,062 A | 5/1999 | Loewenhardt et al. | |
| 6,019,166 A | 2/2000 | Viswanath et al. | |
| 6,137,562 A | 10/2000 | Masuyuki et al. | |
| 6,160,430 A | 12/2000 | Drapkin et al. | |
| 6,198,616 B1 | 3/2001 | Dahimene et al. | |
| 6,220,561 B1 | 4/2001 | Garcia | |
| 6,247,579 B1 | 6/2001 | Fujiyama et al. | |
| 6,304,424 B1 | 10/2001 | Mett et al. | |
| 6,313,567 B1 | 11/2001 | Maltabes et al. | |

(Continued)

OTHER PUBLICATIONS

Nien, C.C. et al. "In-Situ Monitoring of Cavity Filling in Nanoimprint by Capacitance", document 27P-7-49 from IEEE Xplore, pp. 200-201. date unknown.*

(Continued)

*Primary Examiner*—Yogendra N Gupta
*Assistant Examiner*—Emmanuel S Luk
(74) *Attorney, Agent, or Firm*—Laura C. Robinson

(57) ABSTRACT

The present invention is directed towards a chucking system, including, inter alia, a body having a surface with a pin extending therefrom having a throughway defined therein, and a land surrounding the protrusions defining a channel between the pin and the land. In a further embodiment, the body comprises a plurality of protrusions.

18 Claims, 7 Drawing Sheets

U.S. PATENT DOCUMENTS

| | | | |
|---|---|---|---|
| 6,512,401 | B2 | 1/2003 | Clark et al. |
| 6,736,408 | B2 | 5/2004 | Olgado et al. |
| 6,762,826 | B2 | 7/2004 | Tsukamoto et al. |
| 6,771,372 | B1 | 8/2004 | Traber |
| 6,805,054 | B1 | 10/2004 | Meissl et al. |
| 6,809,802 | B1 | 10/2004 | Tsukamoto et al. |
| 6,898,064 | B1 | 5/2005 | Berman et al. |
| 6,909,588 | B2 | 6/2005 | Moffatt |
| 6,909,998 | B2 | 6/2005 | Hocheng et al. |
| 6,921,615 | B2 | 7/2005 | Sreenivasan et al. |
| 6,951,173 | B1 | 10/2005 | Meissl et al. |
| 6,965,506 | B2 | 11/2005 | Howald |
| 6,980,282 | B2 | 12/2005 | Choi et al. |
| 7,019,819 | B2 | 3/2006 | Choi et al. |
| 7,023,238 | B1 | 4/2006 | Camarota |
| 7,406,759 | B2 | 8/2008 | Yamamoto |
| 7,635,445 | B2 | 12/2009 | Choi et al. |
| 7,636,999 | B2 | 12/2009 | Choi et al. |
| 2002/0018190 | A1 | 2/2002 | Nogawa et al. |
| 2002/0069525 | A1 | 6/2002 | Hada et al. |
| 2002/0098426 | A1 | 7/2002 | Sreenivasan et al. |
| 2002/0150398 | A1 | 10/2002 | Choi et al. |
| 2003/0092261 | A1 | 5/2003 | Kondo et al. |
| 2003/0166814 | A1 | 9/2003 | Sparrowe et al. |
| 2003/0179354 | A1 | 9/2003 | Araki et al. |
| 2003/0203319 | A1 | 10/2003 | Lee |
| 2004/0046271 | A1 | 3/2004 | Watts |
| 2004/0065976 | A1 | 4/2004 | Sreenivasan et al. |
| 2004/0112861 | A1 | 6/2004 | Choi et al. |
| 2004/0141163 | A1 | 7/2004 | Bailey et al. |
| 2004/0249609 | A1 | 12/2004 | Hocheng et al. |
| 2005/0046449 | A1 | 3/2005 | Davis |
| 2005/0067097 | A1 | 3/2005 | Yamamoto et al. |
| 2005/0160934 | A1 | 7/2005 | Xu et al. |

OTHER PUBLICATIONS

PCT/US07/07487 ISR, Jun. 4, 2008.
PCT/ US2006/001160 International Search Report, Jun. 12, 2008.
Feldman, Wafer Chuck for Magnification Correction in X-ray Lithography. J. Vac. Sci. Technol. 8 16(6), pp. 3476-3479 Nov. 1, 1998.
U.S. Appl. No. 11/136,885, naming Inventors Nimmakayala et al., entitled Substrate Support System, filed May 25, 2005.
U.S. Appl. No. 11/136,891, naming Inventors GanapathiSubramanian et al., entitled Adaptive Shape Substrate Support System, filed May 25, 2005.
U.S. Appl. No. 11/389,731, naming Inventors Choi et al., entitled Chucking System for Modulating Shapes of Substrates, filed Mar. 27, 2006.
Office Action for U.S. Appl. No. 11/108,208; pp. 1-5; Jan. 7, 2009.
Office Action for U.S. Appl. No. 11/108,208; pp. 1-10; May 15, 2008.
Office Action for U.S. Appl. No. 11/108,208; pp. 1-5; Jun. 16, 2009.
Office Action for U.S. Appl. No. 11/047,499; pp. 1-8; Jun. 26, 2008.
Office Action for U.S. Appl. No. 11/047,499; pp. 1-8; Feb. 3, 2009.

* cited by examiner

# CHUCKING SYSTEM FOR NANO-MANUFACTURING

CROSS-REFERENCE TO RELATED APPLICATIONS

The present application is a divisional patent application of U.S. patent application Ser. No. 11/047,499, filed Jan. 31, 2005, entitled "Method of Retaining a Substrate to a Wafer Chuck", naming inventors Byung-Jin Choi, Anshuman Cherala and Daniel A. Babbs, now U.S. Pat. No. 7,636,999, issued on Dec. 29, 2009; U.S. patent application Ser. No. 11/108,208, filed Apr. 18, 2005 is a division of the present application, entitled "Methods of Separating a Mold from a Solidified Layer Disposed on a Substrate," naming inventors Byung-Jin Choi, Anshuman Cherala, Yeong-jun Choi, Mario J. Meissl, Sidlgata V. Sreenivasan, Norman E. Schumaker, Ian M. McMackin and Xiaoming Lu, now U.S. Pat. No. 7,635,445, issued on Dec. 22, 2009; U.S. patent application Ser. No. 11/690,480, filed Mar. 23, 2007 is a continuation in part of the present application, entitled "Chucking System Comprising an Array of Fluid Chambers", now U.S. Pat. No. 7,635,263, issued on Dec. 12, 2009.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided by the terms of N66001-01-1-8964 and N66001-02-C-8011 awarded by the Defense Advanced Research Projects Agency (DARPA).

BACKGROUND OF THE INVENTION

The field of the invention relates generally to nano-fabrication of structures. More particularly, the present invention is directed to a chucking system to facilitate separating a template from a solidified layer disposed on a substrate in an imprint lithography process.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithographic processes are described in detail in numerous publications, such as United States published patent application 2004/0065976, filed as U.S. patent application Ser. No. 10/264,960, entitled, "Method and a Mold to Arrange Features on a Substrate to Replicate Features having Minimal Dimensional Variability"; United States published patent application 2004/0065252, filed as U.S. patent application Ser. No. 10/264,926, entitled "Method of Forming a Layer on a Substrate to Facilitate Fabrication of Metrology Standards"; and United States published patent application 2004/0046271, filed as U.S. patent application Ser. No. 10/235,314, entitled "Functional Patterning Material for Imprint Lithography Processes," all of which are assigned to the assignee of the present invention.

The fundamental imprint lithography technique disclosed in each of the aforementioned United States published patent applications includes formation of a relief pattern in a polymerizable layer and transferring a pattern corresponding to the relief pattern into an underlying substrate. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is separated from the solidified layer such that the template and the substrate are spaced-apart. The substrate and the solidified layer are then subjected to processes to transfer, into the substrate, a relief image that corresponds to the pattern in the solidified layer.

It is desirable to provide an improved method of separating a template from a solidified layer.

SUMMARY OF THE INVENTION

The present invention is directed towards a chucking system, including, inter alia, a body having a surface with a pin extending therefrom having a throughway defined therein, and a land surrounding the protrusions defining a channel between the pin and the land. In a further embodiment, the body comprises a plurality of protrusions. The configuration of the chucking system allows varying the chucking force. The present invention is directed towards a method of separating a mold, included in a template, from a solidified layer disposed on a substrate. The method includes, inter alia, applying a separation force to the template to separate the template from the layer; and facilitating localized deformation in the substrate to reduce the magnitude of separation force required to achieve separation. It is believed that by reducing the separation forces, damage to the recorded layer may be minimized. It is believed that the present chucking system reduces the separation forces required and results in minimization of damage to the recorded layer during separation. These embodiments and others are described more fully below.

DETAILED DESCRIPTION OF THE INVENTION

Figure 1:
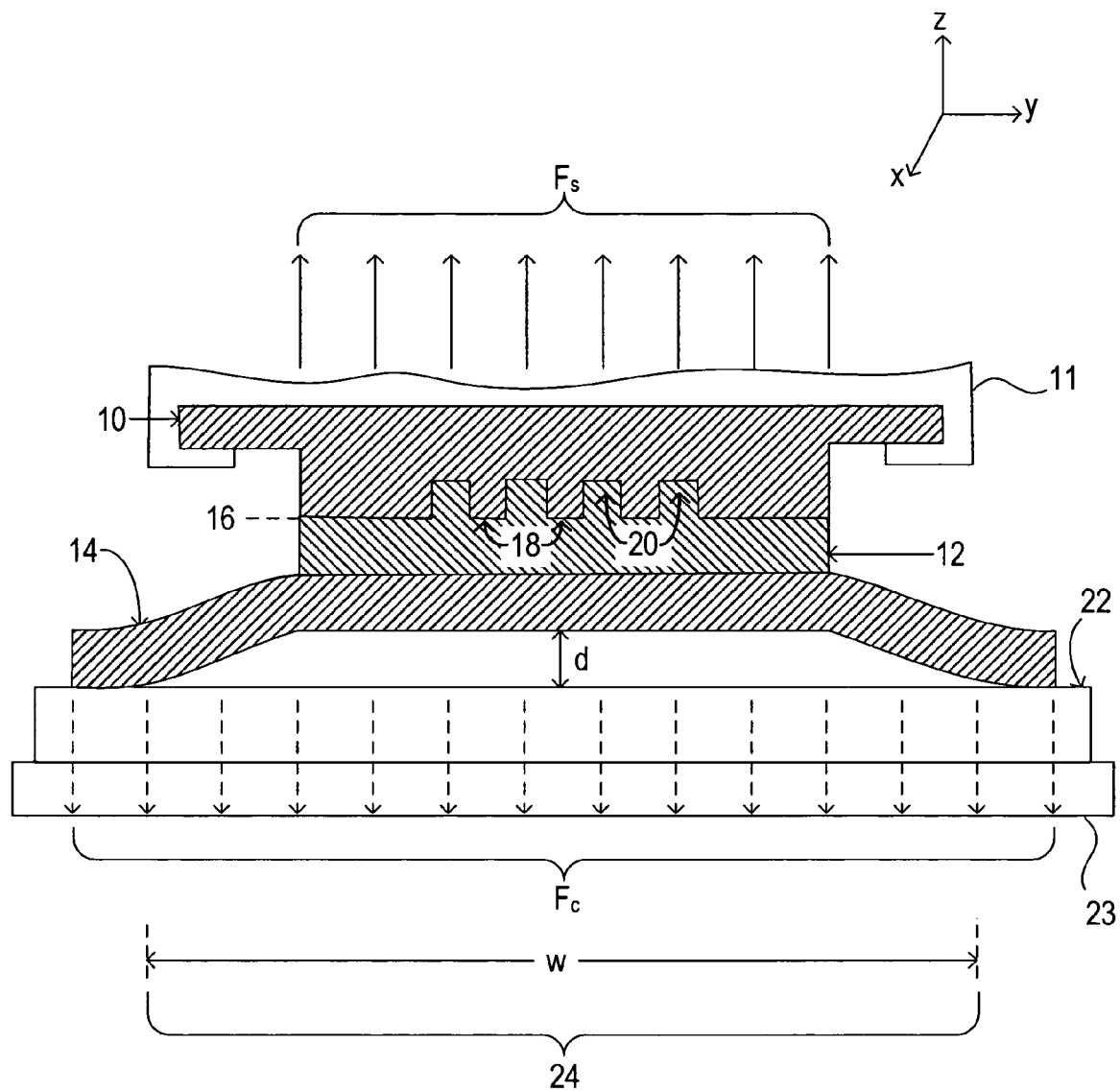
FIG. 1 is a cross-sectional view of a template in contact with an imprinting layer, disposed upon a substrate in accordance with the prior art.

Referring to FIG. 1, a template 10 is shown in contact with an imprinting layer 12. Typically, template 10 may be comprised of fused silica and imprinting layer 12 may be formed from any material known in the art. Exemplary compositions for imprinting material 12 are disclosed in U.S. patent application Ser. No. 10/763,885, filed Jan. 24, 2003, entitled Materials and Methods for Imprint Lithography, which is incorporated by reference. Imprinting layer 12 may be positioned on a substrate 14, with substrate 14 having a thickness 't' associated therewith. Substrate 14 may be formed from virtually any material including silicon, fused silica, metal or compound materials typically associated with the manufacture of integrated circuits. Template 10 comprises a surface 16 having a plurality of features disposed thereon, with the plurality of features comprising a plurality of protrusions 18 and recessions 20. The plurality of protrusions 18 and recessions 20 form a pattern to be transferred into imprinting layer 12, forming a relief image therein. More specifically, template 10 contacts imprinting layer 12 such that the material of imprinting layer 12 ingresses into and fills the plurality of recessions 20 to form imprinting layer 12 with a contiguous structure across surface 16 of template 10, wherein typically the atmosphere surrounding template 10 and imprinting layer 12 may be saturated with helium. Template 10 may be connected to an imprint head 11. The imprint head 11 may be adapted to move along the X-, Y-, and/or Z-axes, thereby generating separation force $F_S$ by moving template 10 along the Z-axis away from substrate 14. To that end, substrate 14 typically remains in a fixed position with respect to the Z-axis while imprint head 11 undergoes movement.

Imprinting layer 12 may be formed from a photo-sensitive material such that when exposed to an actinic component, the same is polymerized and cross-linked to form a solidified material. The actinic component may include ultraviolet wavelengths, thermal energy, electromagnetic energy, visible light and the like. The actinic component employed is known to one skilled in the art and typically depends on the material from which imprinting layer 12 is formed.

Solidification of imprinting layer 12 occurs after template 10 makes contact therewith and the imprinting layer 12 fills the plurality of recessions 20. Thereafter, template 10 is separated from imprinting layer 12. In this manner, the relief image is recorded into imprinting layer 12 with a pattern corresponding to the pattern of template 10.

Separation of template 10 from solidified imprinting layer 12 is achieved by application of a force $F_s$, to template 10. The separation force $F_s$, is of sufficient magnitude to overcome adhesion forces between template 10 and solidified imprinting layer 12 and the resistance of substrate 14 to strain (deformation). It is believed that deformation of a portion of substrate 14 facilitates separation of template 10 from solidified imprinting layer 12. Wafer chuck 22 may retain substrate 14 during separation using any number of well known straining forces, $F_c$, e.g., electrostatic forces, magnetic forces, vacuum forces and the like. As a result, the direction of separation force $F_s$ is typically opposite to that of the direction of the straining force $F_c$. Typically, wafer chuck 22 is supported by a stage 23 that facilitates movement along X, Y and/or Z axes. An exemplary imprint lithography system is sold under the tradename IMPRIO™ 100 available from Molecular Imprints, Inc. of Austin, Tex.

As shown in FIG. 1, a magnitude of the strain (deformation) of substrate 14 is a function of the separation force $F_s$ applied and typically results in the formation of strained region 24 in which substrate 14 is spaced from wafer chuck 22 a distance d. Strained region 24 is typically generated proximate to a region of imprinting layer 12 in contact with template 10, referred to as the processing region.

However, it is desired to minimize the magnitude of the separation force $F_s$ necessary to achieve separation of template 10 and solidified imprinting layer 12. For example, minimizing the magnitude of the separation force $F_s$ facilitates alignment processes so that template 10 and substrate 14 may be properly aligned, as well as allow an increased ratio of template patterning area versus total template area. Additionally, minimizing the separation force $F_s$ necessary to achieve separation of template 10 and solidified imprinting layer 12 reduces the probability of structural comprise of template 10, substrate 14, and solidified imprinting material 12.

Furthermore, deformation of substrate 14 creates potential energy in strained region 24 that is transformed into kinetic energy upon separation of template 10 from solidified imprinting layer 12. Specifically, after separation of template 10 from solidified imprinting layer 12, the separation force $F_s$ upon substrate 14 approaches zero. The straining force $F_c$ and the elasticity of the material from which substrate 14 is formed causes strained region 24 to accelerate toward chuck 22, such that strained region 24 typically collides with wafer chuck 22. It is believed that the collision of strained region 24 with wafer chuck 22 has the deleterious effect of compromising the structural integrity of substrate 14 and the solidified imprinting layer 12 formed thereon. This makes problematic, inter alia, alignment between substrate 14 and template 10.

Figure 2:
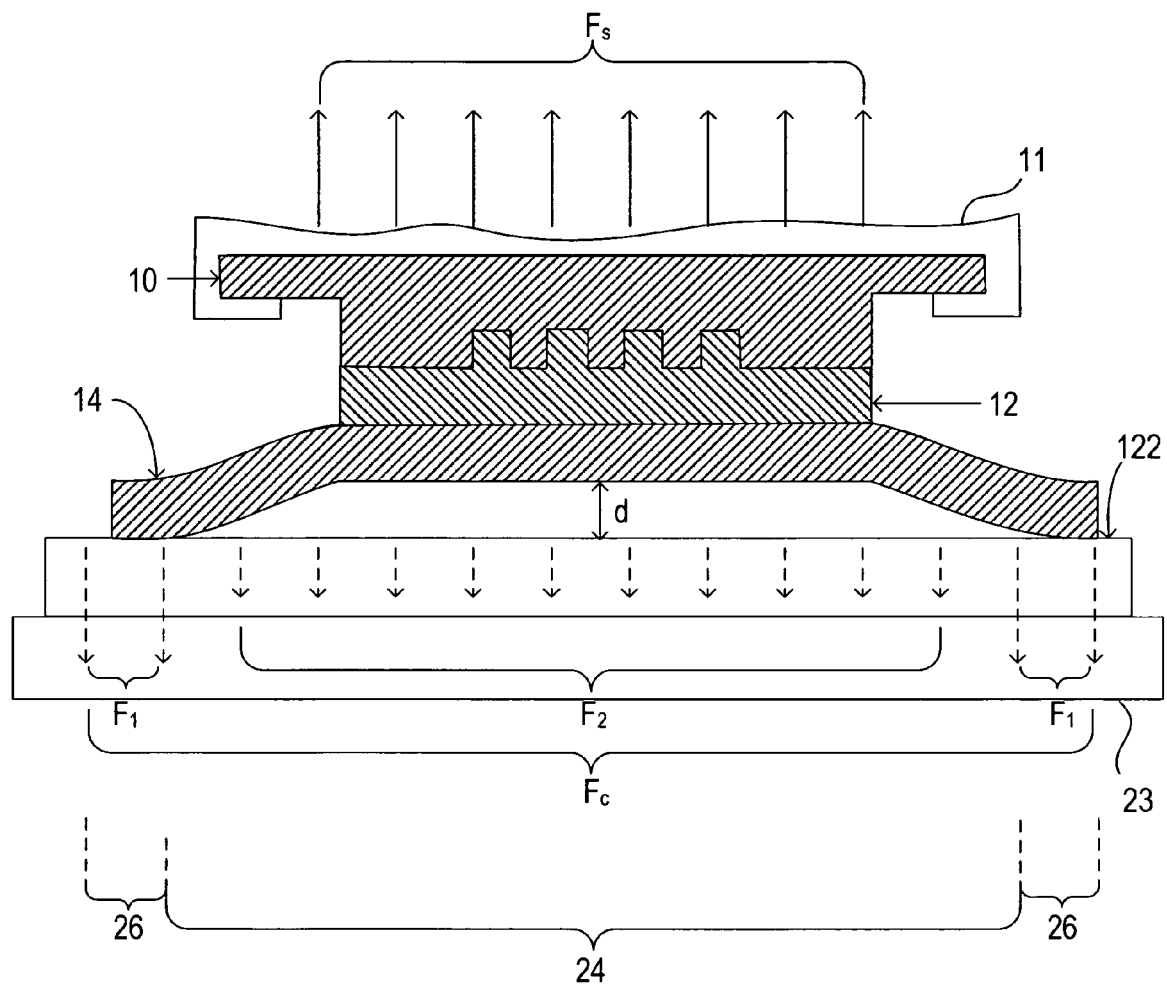
FIG. 2 is a cross-sectional view of a template undergoing separation from an imprinting layer, disposed upon a substrate, in accordance with one embodiment of the present invention.

Referring to FIG. 2, the present invention attenuates, if not prevents, the aforementioned deleterious effects associated with separation of template 10 from solidified imprinting layer 12. This is achieved by reducing, for a given substrate 14, template 10, and solidified imprinting layer 12, the magnitude of the separation force $F_s$ necessary to achieve separation between template 10 and solidified imprinting layer 12. To that end, wafer chuck 122 is configured to control a magnitude of the strain (deformation) to which substrate 14 is subjected, particularly during separation. Wafer chuck 122 generates a straining force $F_c$ from a plurality of independently generated forces $F_1$ and $F_2$. This facilitates providing a straining force $F_c$ that may vary in direction and magnitude across substrate 14. For example, the magnitude of variable forces $F_2$ may be substantially less than the magnitude of chucking forces $F_1$. As a result, when template 10 is subjected to a separation force $F_s$, chucking forces $F_1$ may be associated with a non-strained region 26 of substrate 14, and variable forces $F_2$ may be associated with strained region 24 of substrate 14.

In this example, forces $F_1$ and $F_2$ are both along directions substantially opposite to the direction of the separation force Fs. Separation force $F_S$ may be generated by movement of an imprinting head 11 to which template is connected, as discussed above with respect to FIG. 1. Additionally, wafer chuck 122, shown in FIG. 2, may be supported by a stage 23, as discussed above with respect to FIG. 1. It should be noted, however, that separation force $F_S$ may be generated by keeping the position of template 10 fixed with respect to the Z-axis and moving substrate 14 along the Z-axis away from template 10 employing stage 23. Alternatively, the separation force $F_S$ may result from the combination of moving template 10 and substrate 14 in opposite directions along the Z axis. For purposes of the present discussion, however, the invention is discussed with respect to moving imprint head 11 so that template 10 moves along the Z axis away from substrate 14, while substrate remains fixed with respect to the Z axis.

It should be noted that the magnitude of forces $F_1$ and $F_2$ may have virtually any value desired, so long as portions of substrate 14 outside of strained region 24 is retained upon wafer chuck 122 when the same is subjected to separation force Fs. For example, variable forces $F_2$ may have a magnitude approaching zero. As a result of the magnitude of variable forces $F_2$ being substantially less than the magnitude of chucking forces $F_1$, the magnitude of the separation force $F_S$ required to separate template 10 from solidified imprinting layer 12 may be reduced. More specifically, the magnitude of variable forces $F_2$ are established to facilitate strain (deformation) of a portion of substrate 14 in superimposition with template 14 in response to separation force $F_S$, referred to as strained region 24.

Figure 3:
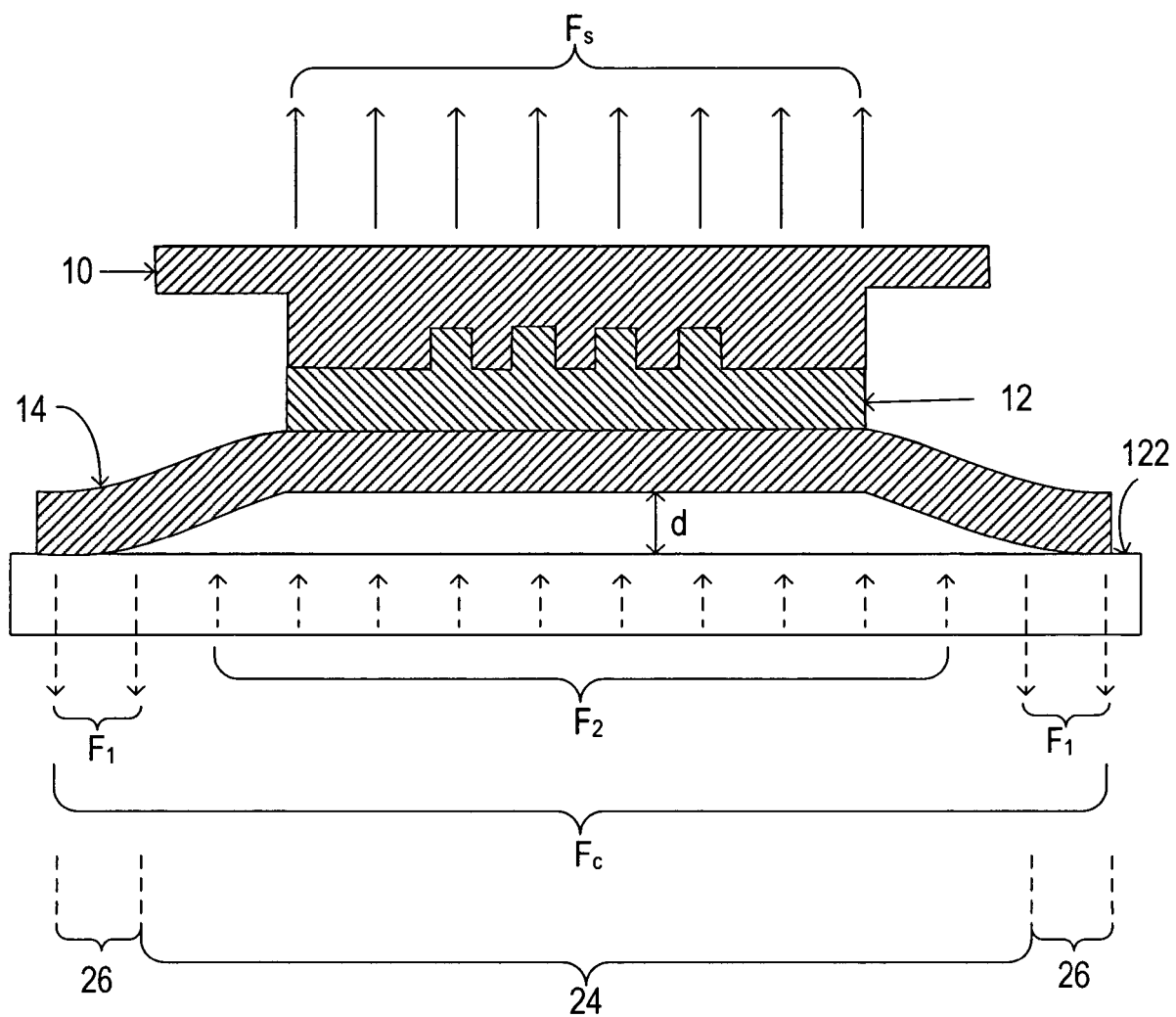
FIG. 3 is a cross-sectional view of a template undergoing separation from an imprinting layer, disposed upon a substrate, in accordance with a second embodiment of the present invention.

Referring to FIG. 3, alternatively, straining force $F_c$ may be varied across substrate 14 such that the direction of variable forces $F_2$ may be opposite to the direction of chucking forces $F_1$ and commensurate with the direction of separation force $F_s$. The magnitude of the variable forces $F_2$ may be the same, greater or less than a magnitude of chucking forces $F_1$. In this manner, localized deformation of substrate 14 is facilitated by variable forces $F_2$ pushing strained region 24 away from wafer chuck 122. This may or may not be independent of the presence of separation force $F_S$.

As mentioned above, in the present example chucking forces $F_1$ function to hold substrate 14 upon wafer chuck 122 when subjected to separation force $F_s$. As a result of the direction of the variable forces $F_2$ being substantially the same as the direction of the separation force $F_s$, the magnitude of the separation forces $F_s$ required to separate template 10 from solidified imprinting layer 12 may be reduced.

Furthermore, as a result of variable forces $F_2$ being in a direction substantially the same as the direction of separation force $F_s$, the variable forces $F_2$ may reduce the impact, if not avoid collision, of strained region 24 with template 10. More specifically, second variable forces $F_2$ reduce the velocity, and thus, the kinetic energy of strained region 24 as the same propagates towards wafer chuck 122, after separation of template 10 from solidified imprinting layer 12. In this manner, strained region 24 comes to rest against wafer chuck 122 without unduly compromising the structural integrity of the same.

After separation of template 10 from solidified imprinting layer 12, the magnitude and direction of variable forces $F_2$ may be changed. For example, variable forces $F_2$ may be provided to have the same magnitude and direction as chucking forces $F_1$. Further, the change in magnitude and direction of variable forces $F_2$ may vary linearly during a period of time such that the magnitude of variable forces $F_2$ having a direction opposite to chucking forces $F_1$ approaches zero. Upon reaching zero variable forces $F_2$ change direction and are slowly increased to be commensurate with the magnitude and direction of chucking forces $F_1$. As a result, substrate 14 may be subjected to a gradient of variable forces $F_2$ that slowly decelerate strained region 24 and gradually increase to fixedly secure substrate 14 to wafer chuck 122. Therefore, an abrupt deceleration of substrate 14 in response to contact with wafer chuck 122, i.e., a collision, may be avoided while minimizing the force of impact with wafer chuck 122.

Before separation of template 10 from solidified imprinting layer 12, the direction of the variable forces $F_2$ may be substantially the opposite as the direction of separation force $F_s$, as described above with respect to FIG. 2. However, upon separation of template 10 from solidified imprinting layer 12, the direction of variable forces $F_2$ may be substantially the same as the direction of separation force $F_s$, as described above with respect to FIG. 3.

Figure 4:
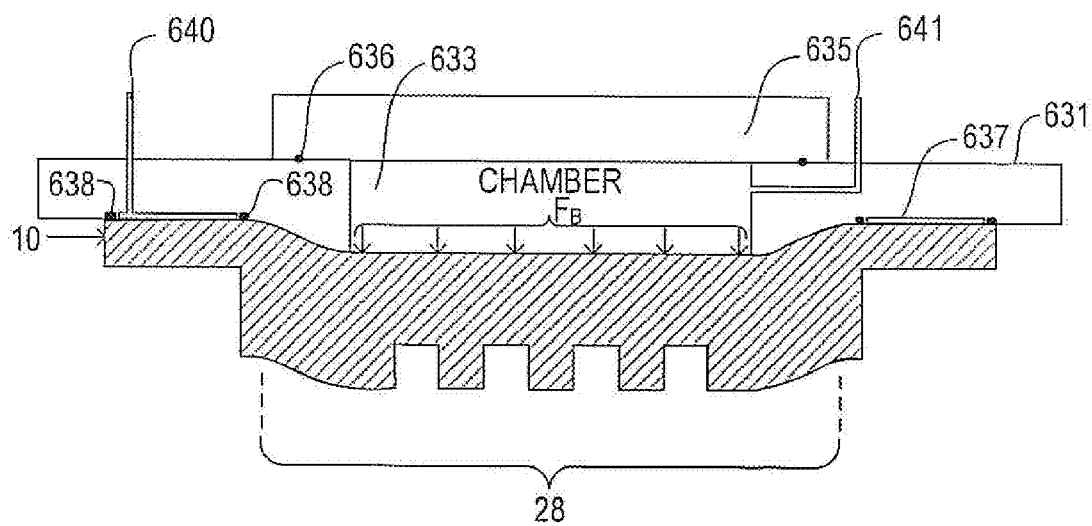
FIG. 4 is a cross-sectional view of a template mounted to a template holder in accordance with the present invention.

Referring to FIGS. 1 and 4, to further facilitate the separation of template 10 from imprinting layer 12, template 10 may be subjected to a bowing force $F_B$. More specifically, bowing force $F_B$ may be applied along a center region 628 of template 10 and along a direction opposite to that of the direction of the separation force Fs, shown in FIG. 1. The bowing force $F_B$ may be applied in conjunction with, or independent of, varying the magnitude and the direction of the straining forces Fc, as discussed above. To that end, template 10 may be attached to a template chuck as disclosed in U.S. patent application Ser. No. 10/999,898, filed Nov. 30, 2004, assigned to the assignee of the present patent application and having Cherala et al. identified as inventors, which is incorporated by reference herein.

The template chuck includes a body 631 having a centralized throughway 633, one side of which is sealed by a fused silicate plate 635 and a gasket 636. Surrounding throughway 633 is a recess 637 and gaskets 638. Properly positioning template 10 upon body 631 seals throughway 633 forming a chamber, as well as sealing of recess forming a second chamber surrounding the centralized chamber. The centralized chamber and the second chamber may each be provided with a desired pressurization vis-à-vis passageways 640 and 641, respectively. By evacuating the second chamber and pressurizing the central chamber, bowing force $F_B$ may be applied to template 10 without removing the same from body 631.

Figure 5:
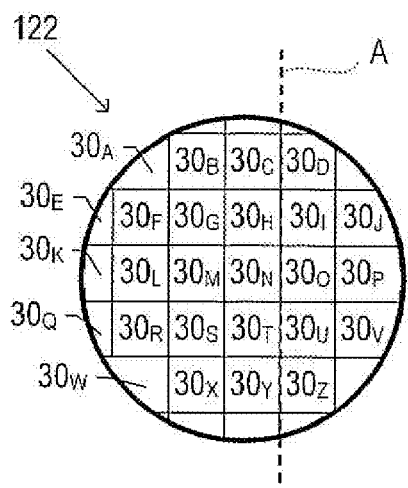
FIG. 5 is a top down view of a wafer chuck demonstrating a first embodiment of differing vacuum sections that may be provided in accordance with the present invention.
Figure 6:
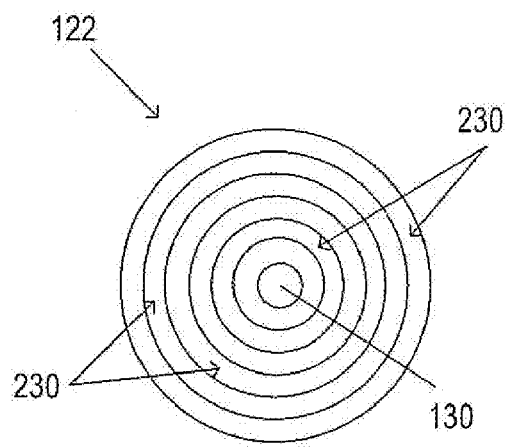
FIG. 6 is a top down view of a wafer chuck demonstrating a second embodiment of differing vacuum sections that may be provided in accordance with the present invention.

Referring to FIGS. 1, 5 and 6, to vary the magnitude and the direction of the straining force $F_c$ across substrate 14, the aforementioned wafer chuck 122 may be employed. Furthermore, the following embodiments may be employed in step and repeat processes, wherein an exemplary step and repeat process is disclosed in United States published patent application No. 2004/0008334 filed as United patent application Ser. No. 10/194,414, assigned to assignee of the present invention and incorporated herein by reference.

To that end, wafer chuck 122 may be configured to provide a plurality of discrete vacuum sections $30_A$-$30_Z$. For purposes of the present invention, each of the plurality of vacuum sections $30_A$-$30_Z$ is defined as providing one or more chucking forces of common magnitude and direction, e.g., there may be one straining force, $F_c$, associated with one of discrete vacuum sections $30_A$-$30_Z$ or multiple chucking forces, each of which are substantially identical in direction and magnitude. The number, size and shape of vacuum sections $30_A$-$30_Z$ may vary dependent upon several factors. Additionally, the size and shape of any one of the plurality of vacuum sections $30_A$-$30_Z$ may differ from the remaining vacuum sections of the plurality of vacuum sections $30_A$-$30_Z$. For example, the size and/or shape of one or more of the vacuum sections may be commensurate with the size and/or shape of the region 24. As a result, each of the plurality of vacuum sections $30_A$-$30_Z$ may be provided with one of a number of shapes, including any polygonal shape, such as the square shape as shown, as well as circular shapes shown as 130 or annular shapes shown as 230, in FIG. 6. Additionally, vacuum sections may include any one or more of irregular shapes 330, shown in FIG. 7.

Figure 7:
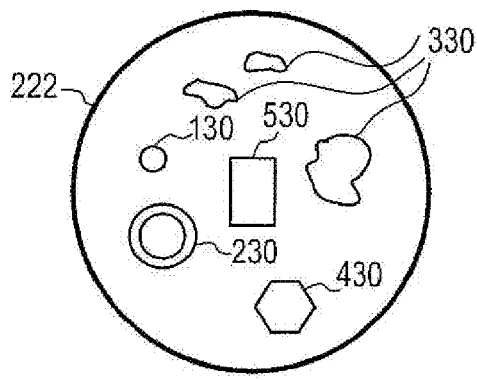
FIG. 7 is a top down view of a wafer chuck demonstrating a third embodiment of differing vacuum sections that may be provided in accordance with the present invention.
Figure 8:
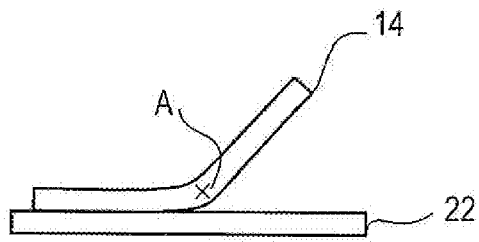
FIG. 8 is a side view of the wafer chuck and substrate shown in FIG. 3 being subject to a release scheme in accordance with an alternate embodiment.

Referring to FIGS. 5-7, although it is possible that each of the plurality of vacuum sections defined on a common wafer chuck 122 have a common shape and size, it is not necessary. Thus wafer chuck 222 may define irregular vacuum sections 330, along with a hexagonal vacuum section 430, a rectangular vacuum section 530, a circular vacuum section 130, and an annular vacuum section 230.

Referring to FIGS. 2, 5, 7 and 8, each of the plurality of vacuum sections $30_A$-$30_Z$ may be individually addressed so that differing chucking forces may be associated with the plurality of vacuum sections $30_A$-$30_Z$. In this manner, the locus of the desired chucking forces, e.g., $F_1$ and/or $F_2$, may be established with great precision. It is desired, however, to vary the straining forces $F_c$ associated with the plurality of vacuum sections $30_A$-$30_Z$ so that substrate 14 may be along an axis that extends across the entire area of substrate 14. To that end, adjacent rows of said plurality of vacuum sections $30_A$-$30_Z$ define a straining force differential $\Delta F_C$. For example, vacuum sections $30_D$, $30_I$, $30_O$, $30_U$, $30_Z$, $30_J$, $30_P$, $30_V$ may generate variable force $F_2$, that is lower than chucking force $F_1$, generated by the remaining vacuum sections, $30_A$, $30_B$, $30_C$, $30_E$, $30_F$, $30_G$, $30_H$, $30_K$, $30_L$, $30_M$, $30_N$, $30_Q$, $30_R$, $30_S$, $30_T$, $30_W$, $30_X$, and $30_Y$. This would enable substrate 14 to bend about axis A, which is facilitated by the force differential $\Delta F_C$ being defined between a first row consisting of vacuum sections $30_D$, $30_I$, $30_O$, $30_U$ and $30_Z$, and a second row consisting of vacuum sections $30_C$, $30_H$, $30_O$, $30_T$ and $30_Y$.

Figure 9:
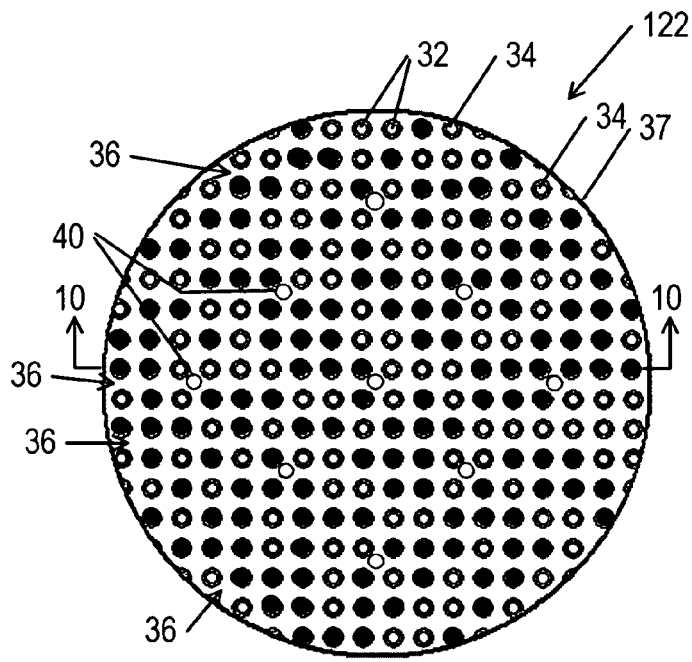
FIG. 9 is a top down view of one embodiment of the wafer chuck shown in FIG. 2.
Figure 10:
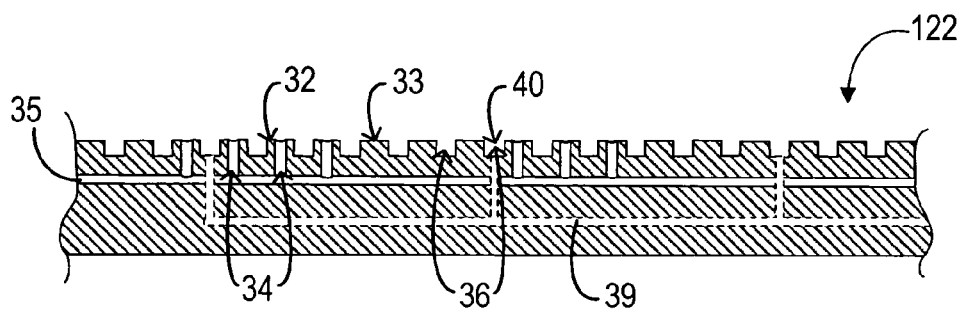
FIG. 10 is a cross-sectional view of the wafer chuck shown in FIG. 9 taken along lines 10-10.
Figure 11:
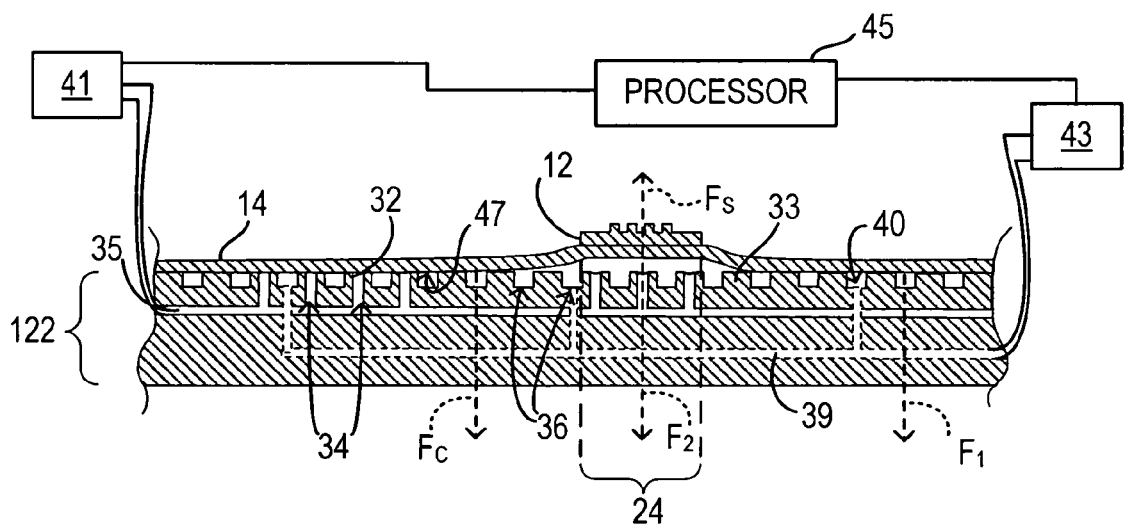
FIG. 11 is a cross-sectional view of a wafer chuck shown in FIG. 10 having a substrate disposed thereon.

Referring to FIGS. 9 and 10, to provide wafer chucks 122 and/or 222 with the aforementioned vacuum characteristics, wafer chuck 122 and 222 are integrally formed from stainless steel or aluminum with a plurality of spaced-apart pins 32 and 33, defining a plurality of channels 36 therebetween. Although shown as having a circular cross-section, each of the plurality of pins 32 and 33 may have virtually any cross-sectional shape desired, including polygonal shapes and typically have a pitch of 3 millimeters. One or more of the plurality of pins 32 are hollow defining a throughway 34 that extends from a passageway 35, terminating in an opening facing substrate 14, as shown in FIG. 11. These are shown as pins 32, with throughway typically having a diameter of approximately 1 millimeter to prevent bowing of the portion of substrate 124 in superimposition therewith.

Although each of pins 32 is shown in fluid communication with a common passageway 35, this is not necessary. Rather, throughway 34 of each of the plurality of pins 32 may be individually addressable such that the volume and direction of fluid passing therethrough per unit time is independent of the fluid flow through throughways 34 associated with the remaining pins 32. This may be achieved by placing one or more of pins 32 in fluid communication with a passageway that differs from the passageways in fluid communication with the remaining pins 32. In a further embodiment, throughways 34 may comprise a stepped structure. The plurality of pins 34 may be surrounded by a land 37 upon which substrate 14 rests. Channels 36 are typically in fluid communication with a common passageway 39 via aperture 40.

Referring to FIGS. 10 and 11, substrate 14 is retained on wafer chuck 122 by straining force $F_c$ generated by fluid flow through channels 36 and/or throughways 34. To that end, passageway 35 is in fluid communication with a pressure control system 41 and passageway 39 is in fluid communication with a pressure control system 43. Both of pressure control systems 41 and 43 are operated under control of processor 45 that is in data communication therewith. To that end, processor 45 may include computer readable code operated on by the processor to carrying out the fluid flows mentioned with respect to FIGS. 2-11. Upon being disposed upon wafer chuck 122, one surface 47 of substrate 14, facing wafer chuck 122, rests against pins 32 and 33. In the presence of the straining force $F_c$, and the absence of separation force $F_s$, an end of throughways 34 facing substrate 14 is substantially sealed, hermetically, by surface 47 resting against pins 32 and 33. No fluid flows between throughways 34 and channels 36 as a result of the seal by surface 47.

Upon application of separation force $F_s$, a portion of surface 47 in superimposition with solidified imprinting layer 12 becomes separated from pins 32 and/or 33. To facilitate this separation by reducing a magnitude of separation force $F_S$ required to achieve the same, pins 32 are disposed throughout the area of wafer chuck 122. The fluid flowing through throughways 34 is selected so that variable force $F_2$ is less than chucking force $F_1$. Typically, chucking force $F_1$ is generated by operating pressure control system 43 at full vacuum. When variable force $F_2$ is operated in a pressure state, it is of sufficient magnitude to generate a pressure of approximately 200 kilo Pascals (kPa) in the volume disposed between strained region 24 and wafer chuck 122. This is usually creates approximately 10 microns of movement of substrate 14 at strained region 24. As a result of the seal being broken, throughways 34 are placed into fluid communication with passageway 39 via channels 36 and apertures 40. This further reduces the magnitude of straining forces $F_C$ in superimposition with strained region 24, thereby reducing the separation force $F_S$ required to separate template 10 from imprinting layer because strain/deformation of substrate 14 in region 24 is facilitated.

Figure 12:
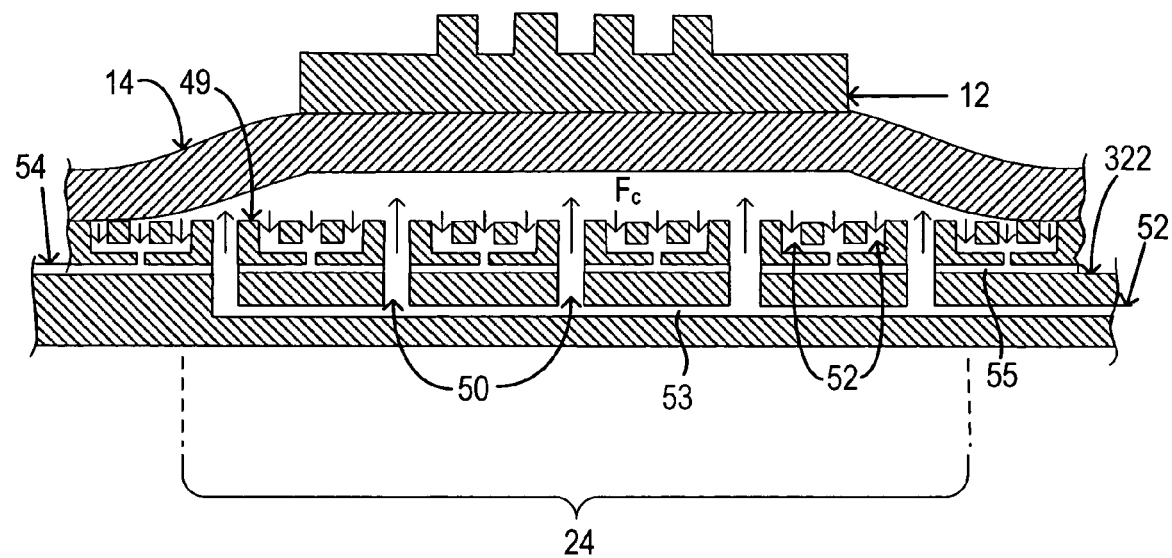
FIG. 12 is a cross-sectional view of a second embodiment of the wafer chuck, shown in FIG. 2, having a substrate disposed thereon.

Referring to FIG. 12, in an alternate embodiment, wafer chuck 322 may provide the aforementioned vacuum characteristics, without use of pins 32 and 33. To that end, a surface 49 of wafer chuck 322 includes a plurality of apertures 50 and 52 that may be configured to have a flow of fluid therethrough, the magnitude and direction of which may be independent of the flow of fluid through the remaining apertures 50 and 52. Apertures typically have a 3 millimeter pitch and a diameter of 2 millimeters, sufficient to reduce the probability of bowing of the portion of substrate 14 in superimposition therewith.

In the present example, apertures 50 are in fluid communication with a common passageway 53 and apertures 52 are in fluid communication with a common passageway 55. The straining force $F_c$ generated by fluid flows through one or more of the plurality of spaced-apart apertures 50 and 52. Before separation, the portion of the plurality of spaced-apart apertures 50 and 52 may have fluid passing therethrough at a first flow rate, 0 sccm or greater. Were separation force $F_s$ present, fluid may pass through apertures 50 and 52 at a flow rate that differs from the first flow rate. Specifically, the flow rate of fluid passing through apertures 50 and 52 may vary in response to the presence of separation force $F_S$. Typically the aforementioned change in flow rate is localized to apertures 50 and 52 in superimposition with strained region 24. The change in flow rate is typically sufficient to reduce the magnitude of the straining force $F_c$. As such, the change in flow rate typically affects the fluid passing though only one of apertures 52 or apertures 50. For example, the flow rate through apertures 52, in superimposition with strained region 24, would change so that the straining force $F_C$ generated thereby is reduced. The flow rate through apertures 50 remains substantially constant.

Referring to FIG. 2, to further assist in separation of template 10 from imprinting layer 12, the imprinting layer may be composed of material that produces a gaseous by-product when exposed to predetermined wavelengths as disclosed in U.S. Pat. No. 6,218,316 which is incorporated by reference herein. The gaseous by-product can produce localized pressure at the interface between imprinting layer 12 and mold the flat surface. The localized pressure can facilitate separation of template 10 from imprinting layer 12. The wavelength of radiation that facilitates generation of the gaseous by-product may include such wavelengths as 157 nm, 248 nm, 257 nm and 308 nm, or a combination thereof. After generation of the gaseous by-product, it is desired to expeditiously commence separation of template 10 so as to minimize damage to imprinting layer 12. Further, the gaseous by-product located between template 10 and imprinting layer 12 may leak out from between template 10 and imprinting layer 12, which is undesirable. Furthermore, the separation of template 10 from imprinting layer 12 should be orthogonal to imprinting layer 12 to minimize distortions of the imprinting layer 12.

Figure 13:
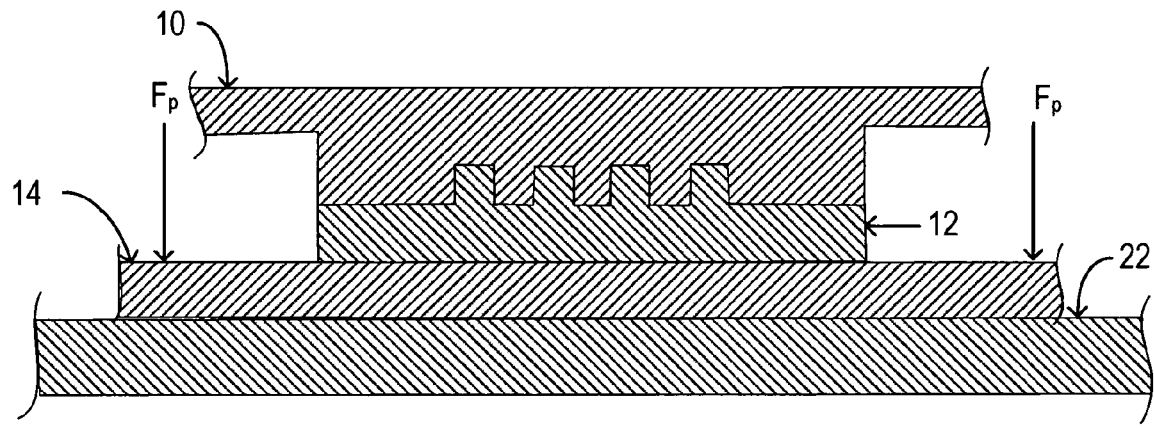
FIG. 13 is a cross-sectional view of a template in contact with an imprinting layer, disposed upon a substrate, wherein the substrate is subjected to a pushing force.
Figure 14:
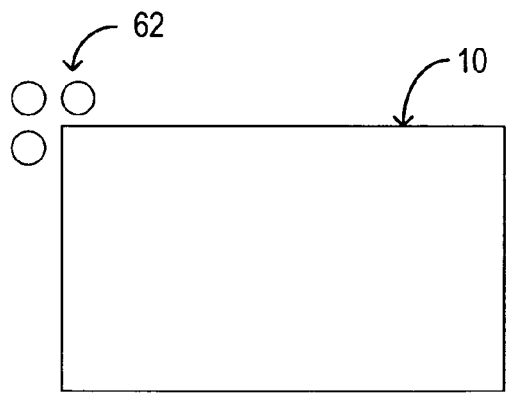
FIG. 14 is a simplified top down plan view showing a template having a plurality of air nozzles arranged locally to exert a pushing force.
Figure 15:
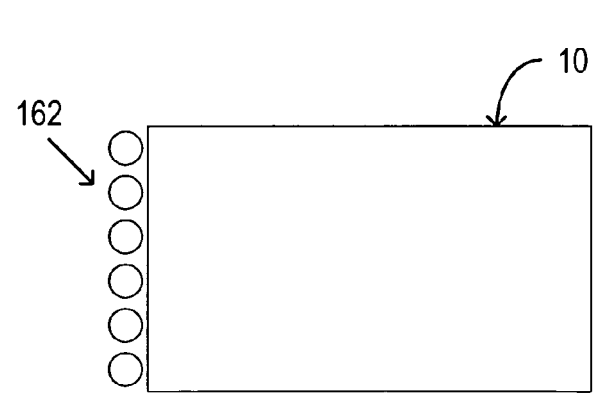
FIG. 15 is a simplified top down plan view showing a template having a plurality of air nozzles arranged as an array to exert a pushing force.

Referring to FIG. 13 to further assist in separation of template 10 from imprinting layer 12, a pushing force $F_p$ may be employed between template 10 and substrate 14. Specifically, the pushing force $F_p$ may be applied proximate to substrate 14 in areas of substrate 14 not in superimposition with template 10. The pushing force $F_p$ facilitates in separation of template 10 by moving substrate 14 away from template 10. To that end, pushing force $F_P$ is directed along a direction opposite to separation force $F_S$; thereby the magnitude of the separation force $F_S$ required to achieve separation may be reduced. The pushing force $F_p$ may be applied by a plurality of air nozzles 62 arranged locally, as shown in FIG. 14, or as an array 162, as shown in FIG. 15. The gas employed within the plurality of air nozzles includes, but is not limited to, nitrogen ($N_2$). The pushing force $F_p$ may be applied independent or in conjunction with varying the straining force $F_c$, as discussed above with respect to FIGS. 2-12.

Figure 16:
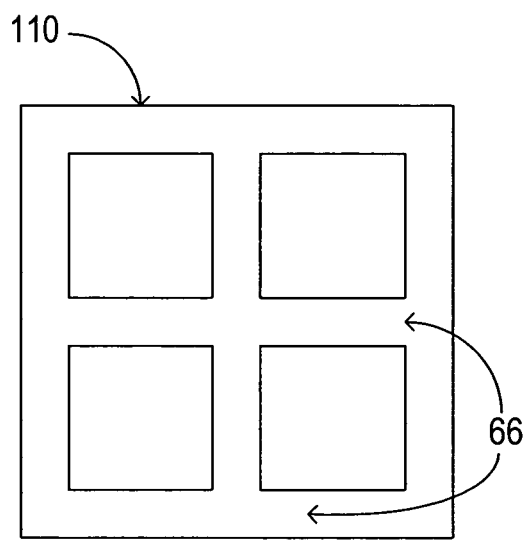
FIG. 16 is a simplified top down plan view showing a template having a plurality of trenches disposed therein to facilitate release of air located between a template and an imprinting layer.
Figure 17:
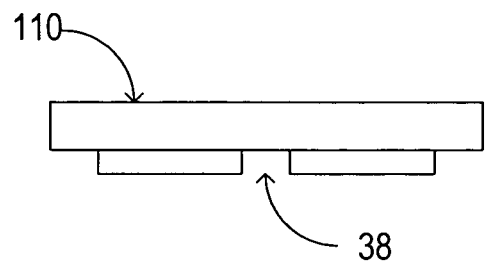
FIG. 17 is a side view of a template shown in FIG. 16.

Referring to FIGS. 2, 16, and 17 to further assist in separation of template 10 from imprinting layer 12, template 10 may comprises a plurality of trenches 38 to decrease the vacuum sealing effect between template 10 and imprinting layer 12. Trenches 66 facilitate release of air positioned between template 10 and imprinting layer 12 when template 10 and imprinting layer 12 are in contact, thus decreasing the vacuum sealing effect between template 10 and imprinting layer 12. As a result, the magnitude of the separation force $F_s$ may be reduced, which is desired.

Figure 18:
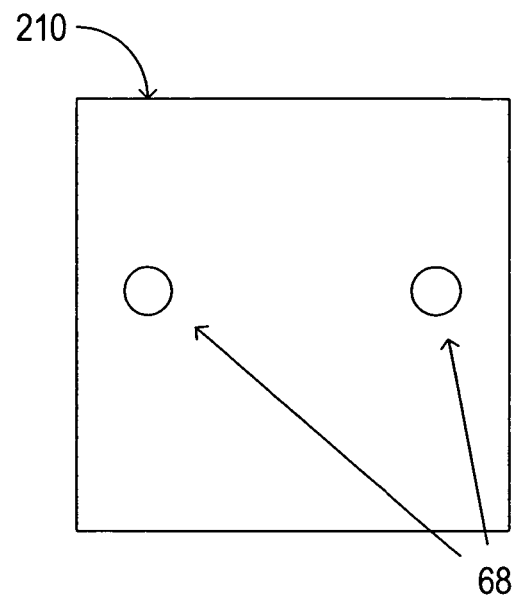
FIG. 18 is a simplified top plan down view showing a template having a plurality of holes disposed therein to facilitate release of air located between a template and an imprinting layer.
Figure 19:
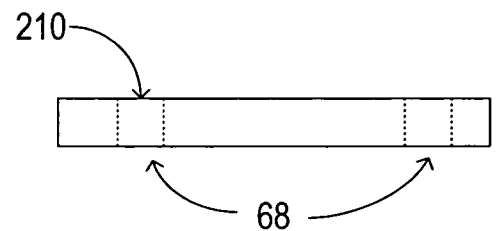
FIG. 19 is a side down view of the template shown in FIG. 17.

Referring to FIGS. 18 and 19, in a further embodiment, template 10 may comprise a plurality of holes 68, wherein the plurality of holes 68 function analogously to trenches 66, such that holes 68 function to decrease the vacuum sealing effect between template 10 and imprinting layer 12.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A chucking system comprising:
   a body having a surface with a plurality of pins extending therefrom, defining a plurality of channels therebetween, a subset of said plurality of pins having a throughway defined therein, with said surface having a plurality of apertures formed therein in superimposition with a subset of said plurality of channels; and
   a land surrounding said pin defining a channel between said pin and said land.

2. The chucking system as recited in claim 1 wherein said surface further includes an aperture formed therein extending from plurality of apertures are in fluid communication with a first passageway and in fluid communication therewith, with said throughway being said plurality of throughways in fluid communication with a second passageway differing from said first passageway.

3. The chucking system as recited in claim 1 further including additional pins with said pin and said additional pins defining a plurality of pins, with wherein each of the pins of a subset of said plurality of pins including includes said throughway defined therein.

4. The chucking system as recited in claim 1 further including additional pins with said pin and said additional pins defining a plurality of pins categorized into first and second subsets, with each of the pins associated with said first subset being wherein an additional subset of said plurality of pins, differing from said subset, is solid and each of the pins associated with said second subset including said throughway.

5. The chucking system as recited in claim 1 further including additional pins with said pin and said additional pins defining a plurality of pins categorized into first and second subsets, with each of the pins associated with said first subset being wherein an additional subset of said plurality of pins, differing from said subset, is solid and each of the pins associated with said second subset including said throughway and said subset of said plurality of pins being in fluid communication with a common passageway.

6. The chucking system as recited in claim 2 wherein said surface further includes an aperture formed therein extending from a first passageway and in fluid communication therewith, with said throughway being in fluid communication with a second passageway and further including a first pressure control system in fluid communication with said first passageway to create a first fluid flow in said channel, and a second pressure control system in fluid communication with said second passageway to create a second fluid flow through said throughway.

7. The chucking system as recited in claim 2 further including first and second pressure control systems and additional pins with said pin and said additional pins defining a plurality of pins, with each of the pins associated with a subset of said plurality of pins including said throughway and being in fluid communication with a first passageway, with said surface including an aperture in fluid with a second passageway, said a first pressure control system being in fluid communication with said first passageway to create a first fluid flow in said throughway and a second pressure control system in fluid communication with said second passageway to create a second fluid flow through said aperture.

8. The chucking system as recited in claim 1 further including a pressure control apparatus and additional pins with said pin and said additional pins defining a plurality of spaced-apart pins with additional channels being formed therebetween, with said surrounding said plurality of pins defining said channel, with said channel and said additional channels defining a plurality of channels, said pressure control apparatus being in fluid communication with said channels and said plurality of pins to provide said wafer chuck chucking system with a plurality of vacuum sections having predetermined shapes.

9. The chucking system as recited in claim 1 wherein each pin of said subset of said plurality of pins having a throughway defined therein is a hollow pin, where said throughway is defined through a hollow section of each pin.

10. A chucking system comprising:
a body having a surface with a plurality of pins extending therefrom, defining a plurality of channels therebetween, a subset of said plurality of pins having a throughway defined therein, with said surface having a plurality of apertures formed therein in superimposition with a subset of said plurality of channels, with said plurality of apertures being in fluid communication with a first passageway and said plurality of throughways being in fluid communication with a second passageway; and,
a pressure control apparatus in fluid communication with said first and second passageways to create flows of fluid through said plurality of apertures and throughways with the characteristics of said fluid flow through said plurality of apertures differing from the characteristics of said flows of fluid through said plurality of throughways to provide said surface with differing chucking forces over an area of said surface.

11. The chucking system as recited in claim 10 wherein said plurality of apertures and throughways are arranged over said area to provide said wafer chuck with a plurality of vacuum sections having a shape selected from a set of shapes consisting essentially of polygonal and circular shapes.

12. The chucking system as recited in claim 10 wherein each pin of said subset of said plurality of pins having a throughway defined therein is a hollow pin, where said throughway is defined through a hollow section of each pin.

13. A chucking system comprising:
a body having an aperture formed therein with a plurality of spaced-apart pins extending from said surface, with each of the pins associated with a first subset being solid and each of the pins associated with a second subset including a throughway and being in fluid communication with a first passageway, with said surface having a plurality of apertures formed therein in fluid communication with a second passageway, with a plurality of channels being defined between said plurality of pins;
a first pressure control system in fluid communication with said first passageway; and
a second pressure control system in fluid communication with said second passageway, with said first and second pressure control systems configured to create flows of fluid through said plurality of throughways and said plurality of apertures to provide differing chucking forces over an area of said surface.

14. The chucking system as recited in claim 13 wherein said plurality of pins are arranged over said surface to provide said chucking system with a plurality of vacuum sections having predetermined shapes in response to said flows of fluid.

15. The chucking system as recited 14 wherein said shapes are selected from a set consisting essentially of annular, polygonal and circular.

16. The chucking system as recited in claim 13 where said fluid flows are established so that fluid communication between said throughway and each of said plurality of channels ceases in response to a substrate resting upon one of said plurality of pins associated with said throughway.

17. The chucking system as recited in claim 13 wherein said flows of fluid associated with said throughway move in a direction opposite to said flows of fluid through said plurality of apertures.

18. The chucking system as recited in claim 13, wherein each pin of said second subset is a hollow pin, where said throughway is defined through a hollow section of each pin.

* * * * *